United States Patent
Mulangattil Sudhakaran et al.

(10) Patent No.: US 12,519,480 B2
(45) Date of Patent: Jan. 6, 2026

(54) SENSOR WITH NOISE MITIGATION

(71) Applicant: Cypress Semiconductor Corporation, San Jose, CA (US)

(72) Inventors: Nidhin Mulangattil Sudhakaran, Unterhaching (DE); Eashwar Thiagarajan, Bothell, WA (US); Bert Sullam, Bellevue, WA (US); Ding Ma, Kirkland, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 78 days.

(21) Appl. No.: 18/657,601

(22) Filed: May 7, 2024

(65) Prior Publication Data

US 2025/0350291 A1 Nov. 13, 2025

(51) Int. Cl.
*H03M 1/08* (2006.01)
(52) U.S. Cl.
CPC ................ *H03M 1/0827* (2013.01)

(58) Field of Classification Search
CPC .... H03M 1/66; H03M 1/0827; H03F 3/45475
See application file for complete search history.

(56) References Cited

U.S. PATENT DOCUMENTS

| | | | |
|---|---|---|---|
| 2009/0128826 A1* | 5/2009 | Keith | G01C 19/726 356/464 |
| 2022/0057317 A1* | 2/2022 | Yamamoto | G01J 3/0286 |
| 2023/0266782 A1* | 8/2023 | Dibbad | G01R 19/16552 327/540 |

* cited by examiner

*Primary Examiner* — Omer S Khan (57) ABSTRACT

One or more computing devices, systems, and/or methods are provided. In an example of the techniques presented herein, a method is provided. The method includes generating a bias signal based on an index, connecting a first amplifier of a first programmable analog block to a sensor terminal, and amplifying a sensor signal received at the sensor terminal in the first amplifier based on the bias signal to generate an amplified sensor signal. The amplified sensor signal is sampled to generate an output sample. Responsive to detecting a limit violation associated with the output sample, the index is modified to generate a modified index and the bias signal is adjusted based on the modified index.

20 Claims, 8 Drawing Sheets

Fig. 8 ically values within the detailed description and

SENSOR WITH NOISE MITIGATION

BACKGROUND

Integrated circuit devices can include both digital and analog circuitry. Analog blocks of circuitry may be reconfigurable to meet demands for multitask processing and facilitate power management. Analog blocks can deliver functionality, such as measuring signal values from sensors and performing comparisons of measured quantities, which digital blocks of circuitry cannot readily provide.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

According to some embodiments, a sensing system comprises a sensor terminal, a digital-to-analog converter (DAC) configured to generate a bias signal based on an index, a first programmable analog block having a first amplifier connected to the sensor terminal and configured to amplify a sensor signal received at the sensor terminal based on the bias signal to generate an amplified sensor signal, an analog-to-digital converter (ADC) configured to sample the amplified sensor signal to generate an output sample, and a controller configured to detect a limit violation associated with the output sample and modify the index to generate a modified index responsive to the limit violation, wherein the DAC is configured to adjust the bias signal based on the modified index.

According to some embodiments, a sensing system comprises a first sensor terminal, a second sensor terminal, a digital-to-analog converter (DAC) configured to generate a bias signal based on an index, a multiplexer connected to the first sensor terminal or the second sensor terminal and configured to generate a sensor output, a first programmable analog block having a first amplifier connected to the sensor output and configured to amplify a sensor signal received at the sensor output based on the bias signal to generate an amplified sensor signal, an analog-to-digital converter (ADC) configured to sample the amplified sensor signal to generate an output sample, and a controller configured to configure the multiplexer to select one of the first sensor terminal or the second sensor terminal, configure the first amplifier based on the configuration of the multiplexer, and responsive to detecting a limit violation associated with the output sample, modify the index to generate a modified index, wherein the DAC is configured to adjust the bias signal based on the modified index.

According to some embodiments, a system comprises means for generating a bias signal based on an index, means for connecting a first amplifier of a first programmable analog block to a sensor terminal, means for amplifying a sensor signal received at the sensor terminal in the first amplifier based on the bias signal to generate an amplified sensor signal, means for sampling the amplified sensor signal to generate an output sample, responsive to detecting a limit violation associated with the output sample, means for modifying the index to generate a modified index, and means for adjusting the bias signal based on the modified index.

According to some embodiments, a method comprises generating a bias signal based on an index, connecting a first amplifier of a first programmable analog block to a sensor terminal, amplifying a sensor signal received at the sensor terminal in the first amplifier based on the bias signal to generate an amplified sensor signal, sampling the amplified sensor signal to generate an output sample, responsive to detecting a limit violation associated with the output sample, modifying the index to generate a modified index, and adjusting the bias signal based on the modified index.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DETAILED DESCRIPTION

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

It is to be understood that the following description of embodiments is not to be taken in a limiting sense. The scope of the present disclosure is not intended to be limited by the embodiments described hereinafter or by the drawings, which are taken to be illustrative only. The drawings are to be regarded as being schematic representations and elements illustrated in the drawings are not necessarily shown to scale. Rather, the various elements are represented such that their function and general purpose become apparent to a person skilled in the art.

All numerical values within the detailed description and the claims herein are modified by "about" or "approximately" the indicated value, and take into account experimental error and variations that would be expected by a person having ordinary skill in the art.

Integrated circuits may include digital components, such as a central processing unit (CPU), and analog components, such as amplifiers. Analog components may be provided as reconfigurable analog blocks, that have configurable inputs, outputs, and resistor-capacitor (RC) circuits that may be configured to change the operating mode of the analog block to meet demands for multitask processing and facilitate power management. To improve power management performance, the analog blocks may be reconfigurable autonomously independent of the CPU, which may remain in a sleep mode or may perform a different operation. The CPU may be located in the same die/substrate as the analog circuits, or may be implemented separately.

Modern computing devices, especially automotive, wearable, hand-held, metering, appliance-integrated, and the like, require increasingly efficient power management. Many portable devices provide significant computational resources into small form factors. Compact dimensions may limit the capacity of portable devices for energy storage. Accordingly, managing energy consumption during execution of various tasks becomes increasingly important. Generally, executing a task faster using fewer components leads to better utilization of energy resources.

In some embodiments, programmable analog blocks may be combined into a programmable analog subsystem (PASS) that may be used in combination with or, in some implementations, separately from a CPU and a memory device. The CPU may have a variety of forms, such as a general purpose processor, an application processing unit (APU), a microcontroller unit (MCU), or some other processing resource programmable to perform specific operations. The CPU may be a separate circuit or a circuit embedded into a larger system. The PASS may comprise an autonomous controller that operates independent of the CPU for decision-making regarding reconfiguring one or more analog blocks, programmable references and/or programmable comparators for use by the analog blocks, analog-to-digital converter (ADC) units, digital-to-analog converter (DAC) units, and/or post processing units. Based on a value of an input received by the PASS, the autonomous controller may reconfigure one or more of the programmable analog blocks to change the operating mode of the analog block. The PASS may perform such reconfiguration without waking up the CPU, if the CPU is in a sleep state, or without requesting a CPU interrupt, if the CPU is in an active state. Independent reconfiguration of the PASS may allow the CPU to perform other functions, such as processing of digital tasks that may be related or unrelated to the tasks that the PASS is performing. This arrangement may allow processing the same task faster if both the PASS and the CPU are processing different parts of the same task, or it may allow concurrent processing of different tasks by the LP PASS and the CPU.

In some embodiments, a programmable analog block comprises one or operational amplifiers. Routing circuitry, such as multiplexers, allow the inputs to the operation amplifier to be configured, and also allow different external circuits, such as resistor circuits, capacitor circuits, or RC circuits to be connected to input or output terminals of the operational amplifier. Example inputs include, optical sensors, such as photodiodes, sound sensors, such as microphones, electrical sensors, such as electrocardiogram (ECG) inputs, motion sensors, environmental sensors, chemical sensors, and/or inputs from other components, such as ADC units or DAC units. Routing circuitry also allows the output of an operation amplifier in the programmable analog block to be routed to different components, such as another programmable analog block, an ADC, an output terminal, a comparator, or some other destination.

Figure 1:
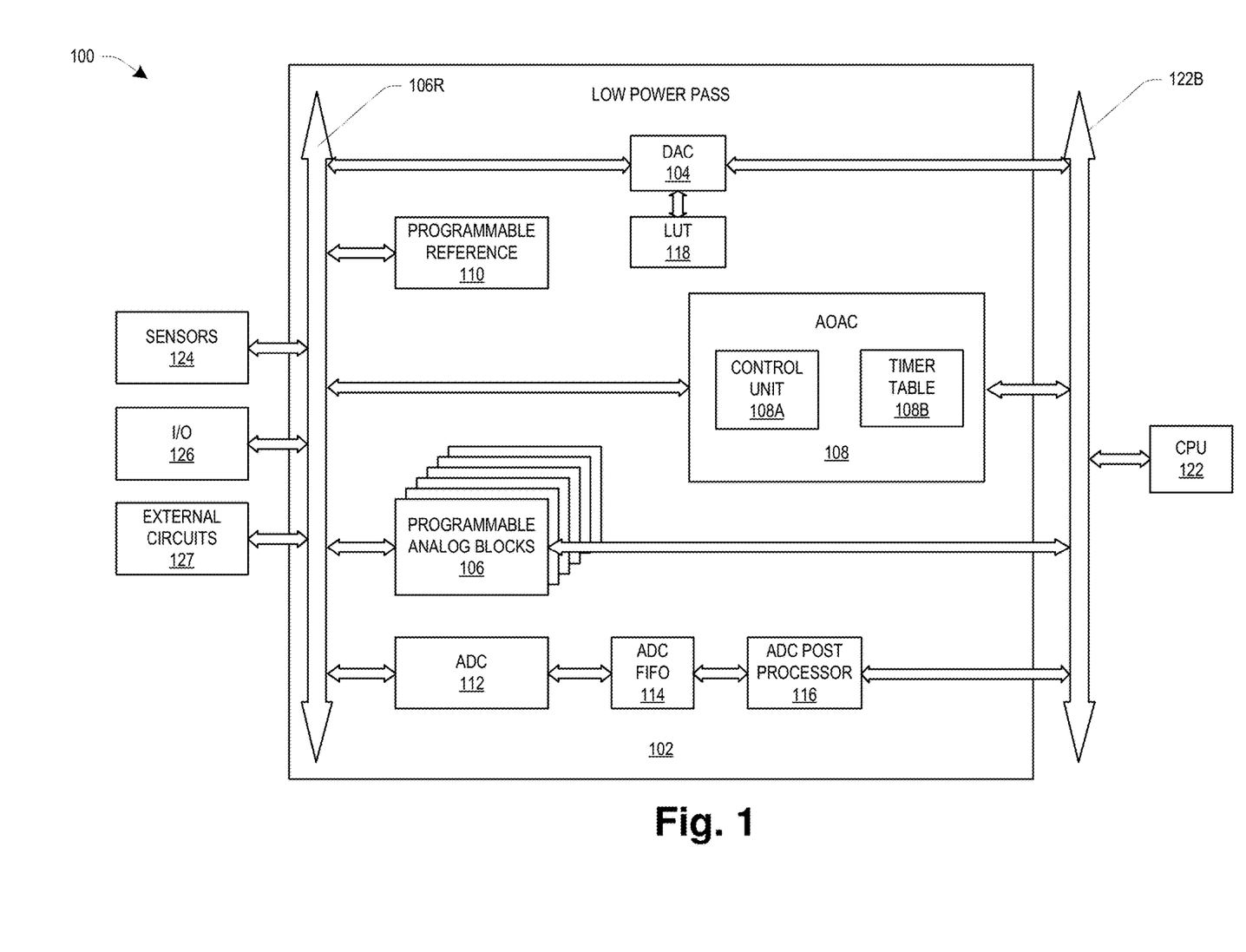
FIG. 1 is a diagram of a sensor system, in accordance with some embodiments.

FIG. 1 is a diagram of system 100 comprising a programmable analog subsystem (PASS) 102, in accordance with some embodiments. In some embodiments, the PASS 102 comprises a DAC 104, programmable analog blocks 106, an always-on autonomous controller (AOAC) 108, a programmable reference unit 110, an ADC 112 an ADC first-in-first-out buffer (FIFO) 114, and an ADC post processor 116. In some embodiments, the AOAC 108 comprises a control unit 108A and a timer table 108B. The timer table 108B stores configuration data for configuring the programmable analog blocks 106 into various operating modes. The control unit 108A, based on inputs to the PASS 102, selects configurations from the timer table 108B for dynamically configuring the programmable analog blocks 106. Routing circuitry 106R allows different input signals to be provided to the programmable analog blocks 106 and/or the ADC 112. Responsive to the input signal, the AOAC 108 may reconfigure one or more of the programmable analog blocks 106 so that the analog circuits may provide functionality that is better adjusted to the changed conditions. In some embodiments, a look-up table (LUT) 118 is associated with the DAC 104 to allow storage of operating profiles for the DAC 104. The AOAC 108 may program the LUT 118 based on the operating mode. The AOAC 108 may instruct the ADC 112 to take output samples until the ADC FIFO 114 is nearly full, before interrupting an external CPU 122 to move the data. The number of programmable analog blocks 106 may vary, such as the six programmable analog blocks 106 illustrated in FIG. 1. More or fewer programmable analog blocks 106 may be provided.

In some embodiments, the control unit 108A includes a finite state machine (FSM). The FSM may be hardware-implemented as a circuit (or a set of circuits) or the FSM may be implemented as instructions executed by the control unit 108A. The control unit 108A may receive an input from the ADC 112 or the ADC post processor 116. Responsive to receiving an input, the FSM may be capable of selecting one or more FSM states that have corresponding settings in the timer table 108B for configuring the programmable analog blocks 106 and/or other elements of the PASS 102.

In some embodiments, the system 100 is embodied in a portable device that may perform functions to measure characteristics of a user's blood, such as continuous glucose monitoring (CGM), blood glucose monitoring (BCM), or electro-impedance spectroscopy (EIS). The system 100 may also support voice communication with the user using voice detection and speech recognition via a microphone.

In some embodiments, the system 100 comprises one or more sensors 124, such as a passive infrared (PIR) sensor, a photodiode, a temperature sensor, or some other type of sensor. The system 100 may comprise one or more I/O devices 126 for receiving user input or providing user output, such as a microphone to support voice processing, a speaker, a keypad, a touch screen, a display, or some other I/O device. One or more external circuits 127 may be provided that connect to external terminals of the PASS 102 for use by the programmable analog blocks 106. The PASS 102 may include fewer components, additional components, different components, and/or a different arrangement of components than those illustrated in FIG. 1. The PASS 102 may interface with a CPU 122 over a CPU bus 122B. The CPU 122 may receive outputs from the DAC 104, the programmable analog blocks 106, the AOAC 108, and/or the ADC post processor 116. The ADC post processor 116 may be considered a data processing unit. In comparison to the CPU 122, the data processing units in the PASS 102 are low power computing units. In some embodiments, the PASS 102 and the CPU 122 may be provided on a single semiconductor die. The AOAC 108 operates independently and without intervention from the CPU 122 to reconfigure the programmable analog blocks 106.

Different configurations of the PASS 102 may have different routing fabrics defined by the routing circuitry 106R. For example, in different configurations different sensors 124 with different analog processing requirements may be employed at different times in the PASS 102 depending on the configuration specified by the AOAC 108. In some embodiments, one or more of the programmable analog blocks 106 may be configured as a buffer, an operational amplifier (OA), a programmable gain amplifier (PGA), a transimpedance amplifier (TIA), a voltage-to-current converter (V2C), an integrator, or as a circuit with some other analog functionality.

Figure 2:
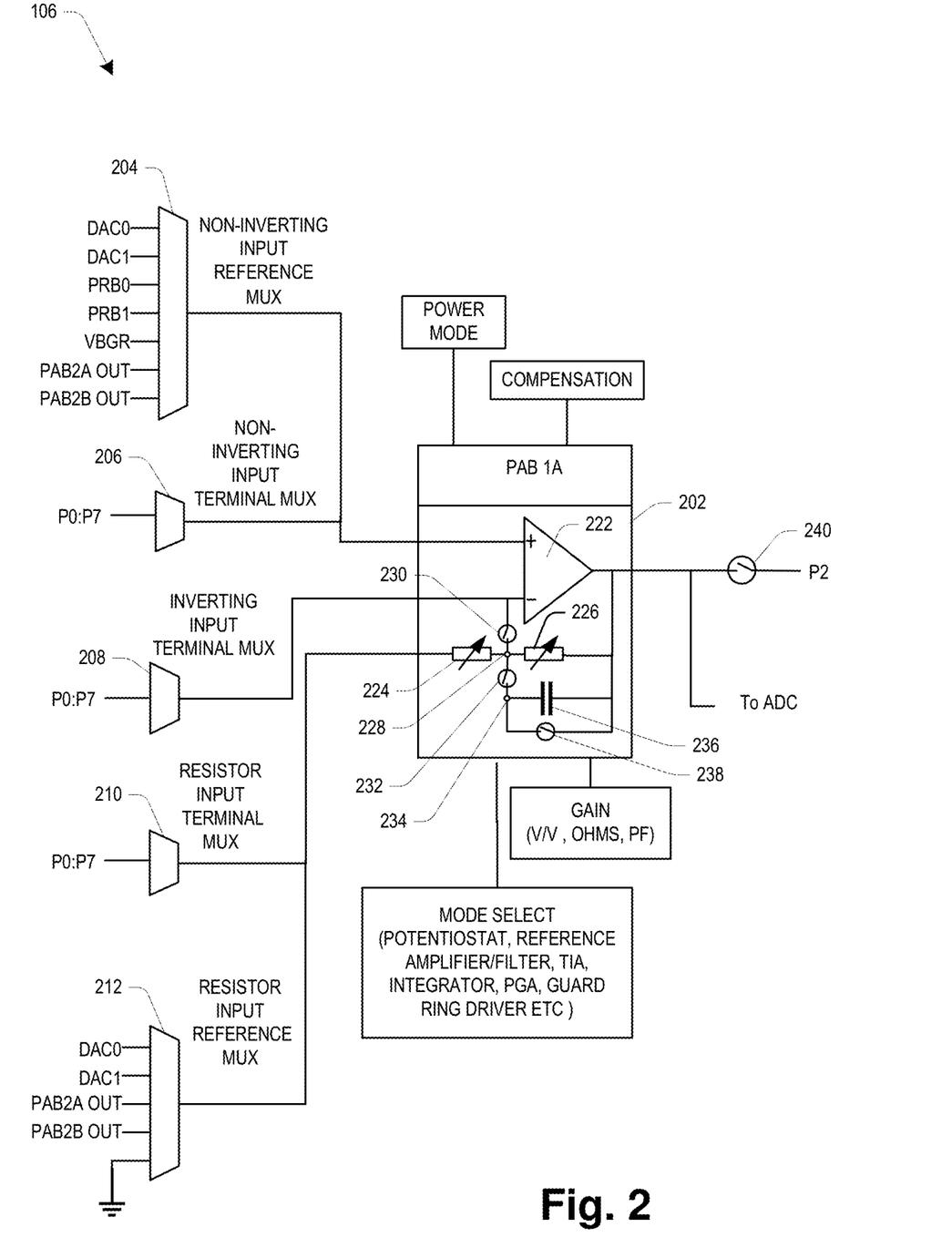
FIG. 2 is a diagram of a programmable analog block, in accordance with some embodiments.

FIG. 2 is a diagram of a programmable analog block 106, in accordance with some embodiments. The programmable analog block 106 comprises an amplifier circuit 202, a non-inverting input reference multiplexer 204, a non-inverting input terminal multiplexer 206, an inverting input terminal multiplexer 208, a resistor input terminal multiplexer 210, and a resistor input reference multiplexer 212.

In some embodiments, the amplifier circuit 202 comprises an operational amplifier 222 having a non-inverting terminal ("+"), an inverting terminal ("−"), a programmable input resistor 224 connected to a programmable feedback resistor 226 at a node 228, a switch 230 connected between the node 228 and the inverting terminal, a switch 232 connected to a node 234, a capacitor 236 connected between the node 234 and an output of the operational amplifier 222, and a switch 238 connected between the node 234 and the output of the operational amplifier 222. The programmable input resistor 224 and the programmable feedback resistor 226 may be configured to have the same resistances or different resistances to affect the gain, to exhibit a short circuit, or to exhibit an open circuit. The switch 232 selectively couples the capacitor 236 or a short circuit through the switch 238 across the feedback path of the operational amplifier 222. The programmable input resistor 224, the programmable feedback resistor 226, and the switches 230, 232, 238 may be configured based on the topology or operating mode of the operational amplifier 222. The terminals connected to the programmable input resistor 224 and the programmable feedback resistor 226 may be swapped to change the gain from a positive gain to a negative gain. The configuration of the operational amplifier 222 is represented by configuration blocks that specify mode select, power mode, gain, and compensation. Compensation options include unity gain compensated, uncompensated, custom gain-based frequency compensation, etc.

The non-inverting input reference multiplexer 204 provides a selected reference signal, such as a DAC0 signal or a DAC1 signal generated by the DAC 104, a programmable reference signal, PRB0, PRB1, generated by the programmable reference unit 110, a band gap reference voltage, VBGR, or a reference generated by outputs of a different PAB 106 (designated as PAB2A OUT or PAB2B OUT). The resistor input reference multiplexer 216 provides reference signals, such as DAC0, DAC1, PAB2A OUT, PAB2B OUT, to the input of the programmable input resistor 224. The non-inverting input terminal multiplexer 206, the inverting input terminal multiplexer 208, and the resistor input terminal multiplexer 210 connect selected terminals (P0:P7) of the PASS 102 to the non-inverting terminal of the operational amplifier 222, the inverting terminal of the operational amplifier 222, and the input of the programmable input resistor 224, respectively. Sensors 124 or external circuits 127 may be connected to the terminals (P0:P7). The output of the operational amplifier 222 may be provided to the ADC 112 or a terminal of the PASS 102 (e.g., P2) by a switch 240.

Figure 3:
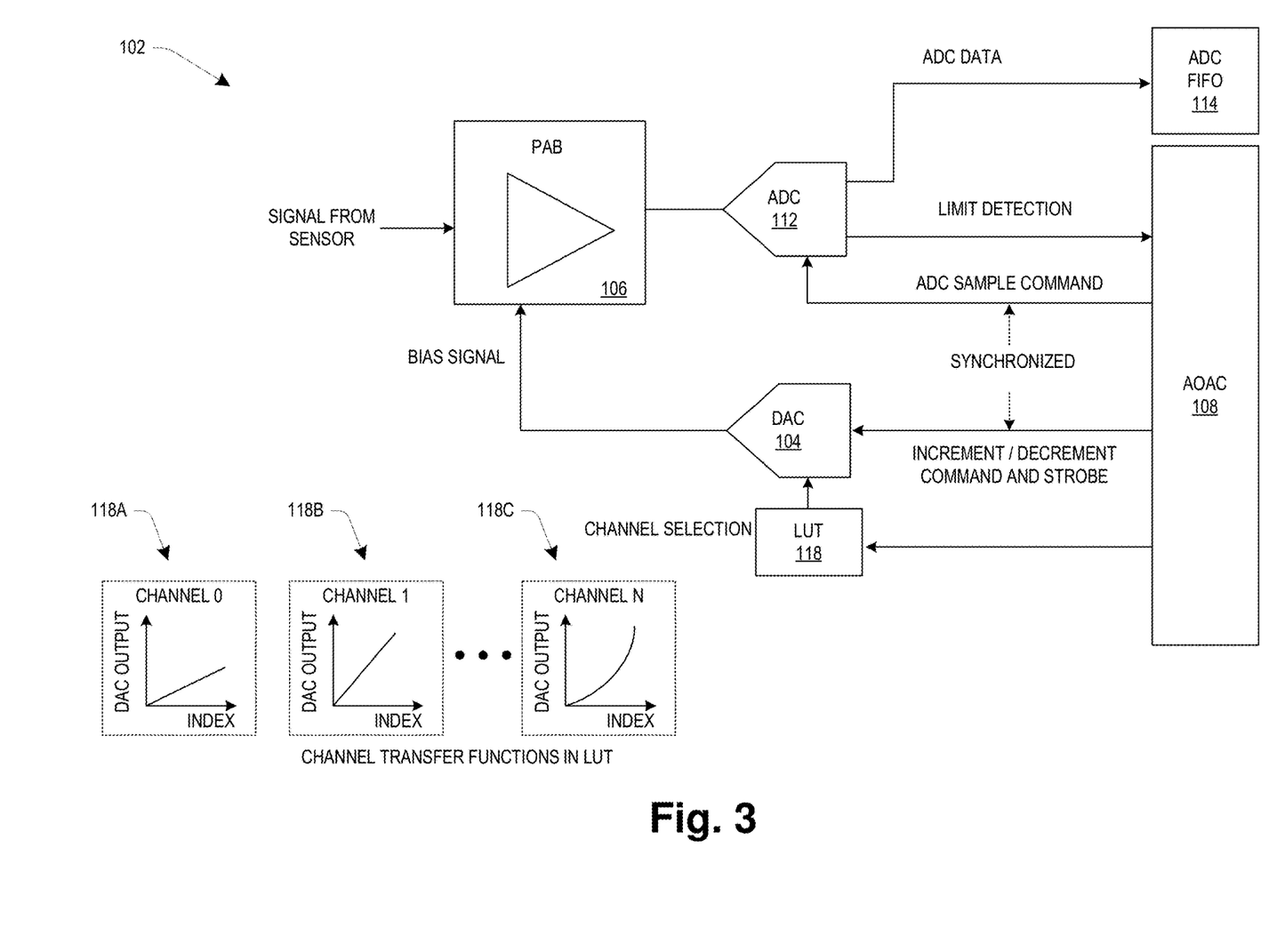
FIG. 3 is a diagram of the sensor system configured to cancel noise in a sensing application, in accordance with some embodiments.

FIG. 3 is a diagram of the PASS 102 configured to cancel noise in a sensing application, in accordance with some embodiments. A signal from a sensor 124 (see. FIG. 1) is received in a PAB 106. The programmable analog block 106 performs an amplifier function depending on the nature of the sensor 124, such as increasing the gain of the sensor signal, converting the sensor signal from a voltage signal to a current signal, converting the sensor signal from a current signal to a voltage signal, integrating the sensor signal, or some other amplifier function. The ADC 112 samples the output of the programmable analog block 106 and stores the output samples in the ADC FIFO 114 for further processing. For example, the CPU 122 (see FIG. 1) may be interrupted in response to a trigger event, such as an elapsed timer, a limit detection, or some other trigger, to process the data in the ADC FIFO 114, for example, in response to a trigger event, the CPU 122 may exit sleep mode and process the data in the ADC FIFO 114 to detect an event sensed by the sensor 124.

In certain applications, the sensor 124 operates under conditions that generate low-frequency noise that can mask the desired sensor event by saturating the amplifier in the PAB 106. In some embodiments, the AOAC 108 dynamically controls a bias signal for the amplifier in the PAB 106 to track the low-frequency noise to prevent masking of the sensor event without intervention by the CPU 122, thereby allowing the CPU 122 to remain in a sleep state until a trigger event is received.

In some embodiments, the AOAC 108 generates the bias signal for the amplifier in the PAB 106 using the DAC 104 to avoid saturation of cutoff of the amplifier. The DAC generates an analog bias signal for the amplifier in the PAB 106. In some embodiments, the AOAC 108 performs limit detection on the output samples generated by the ADC 112 from the amplifier in the PAB 106. A limit violation arising from the limit detection may include a signal exceeding a threshold, a signal falling below a threshold, a signal being inside a predetermined window (i.e., between an upper limit and a lower limit), or a signal being outside a predetermined window. Based on the limit detection, the AOAC 108 modifies the index provided to the DAC 104 to adjust the bias signal to track the low-frequency noise. In one example, if the ADC sample is above the window indicating potential saturation of the amplifier in the PAB 106, the AOAC 108 increments the index of the DAC 104 to increase the bias signal, and if the ADC sample is below the window indicating potential cutoff in the amplifier in the PAB 106, the AOAC 108 decrements the index of the DAC 104 to decrease the bias signal. For a given index value, the DAC 104 outputs a corresponding voltage for the bias signal. In some embodiments, the limits are determined based on the specific application. For example, if the operating voltage of the amplifier in the PAB 106 is 1.8V, the window may be set at 1.6V to 0.2V. In some embodiments, the AOAC 108 may reduce the size of the window to attempt to get the steady state output of the amplifier in the PAB 106 to be near the midpoint of the operating voltage, e.g., 0,9V.

In some embodiments, the DAC 104 employs a transfer function that determines the bias voltage as a function of index value. Transfer functions may be stored in the LUT 118. Example transfer functions 118A, 118B, and 118C are shown in FIG. 3. The transfer function 118A is a linear transfer function. The transfer function 118B is a linear transfer function with a slope greater than the slope of the transfer function 118A, making the transfer function 118B more aggressive (i.e., greater change in bias signal as a function of index value) compared to the transfer function 118B. The transfer function 118C is an exponential transfer function with a slope that increases with the index, making the transfer function 118C the most aggressive. The slope of the transfer function refers to the derivative of the transfer function at a given index and does not imply a linear transfer function. The number of transfer functions stored in the LUT 118 and their associated levels of aggressiveness may vary. Initially, the AOAC 108 may select a more aggressive transfer function to provide faster convergence for the cancelling the low-frequency noise. After initial convergence is reached, the AOAC 108 may select a less aggressive transfer function to more smoothly track the low-frequency noise. If noise conditions change, the AOAC 108 change back to a more aggressive transfer function to track the low-frequency noise. After changing the transfer function, the AOAC 108 sends a strobe signal to reset the DAC 104. In some embodiments, the AOAC 108 sends an index for the new transfer function when strobing the DAC 104 that provides a bias signal matching the previous index to provide a smooth transfer.

In some embodiments, the sample command from the AOAC 108 to the ADC 112 sample command is synchronized with command from the AOAC 108 to the DAC 104 (increment/decrement/strobe) to avoid the need for filtering the output of the DAC 104. Noise generated by the DAC 104 will appear as a DC component that will be canceled by the loop along with the sensor low-frequency noise.

Figure 4:
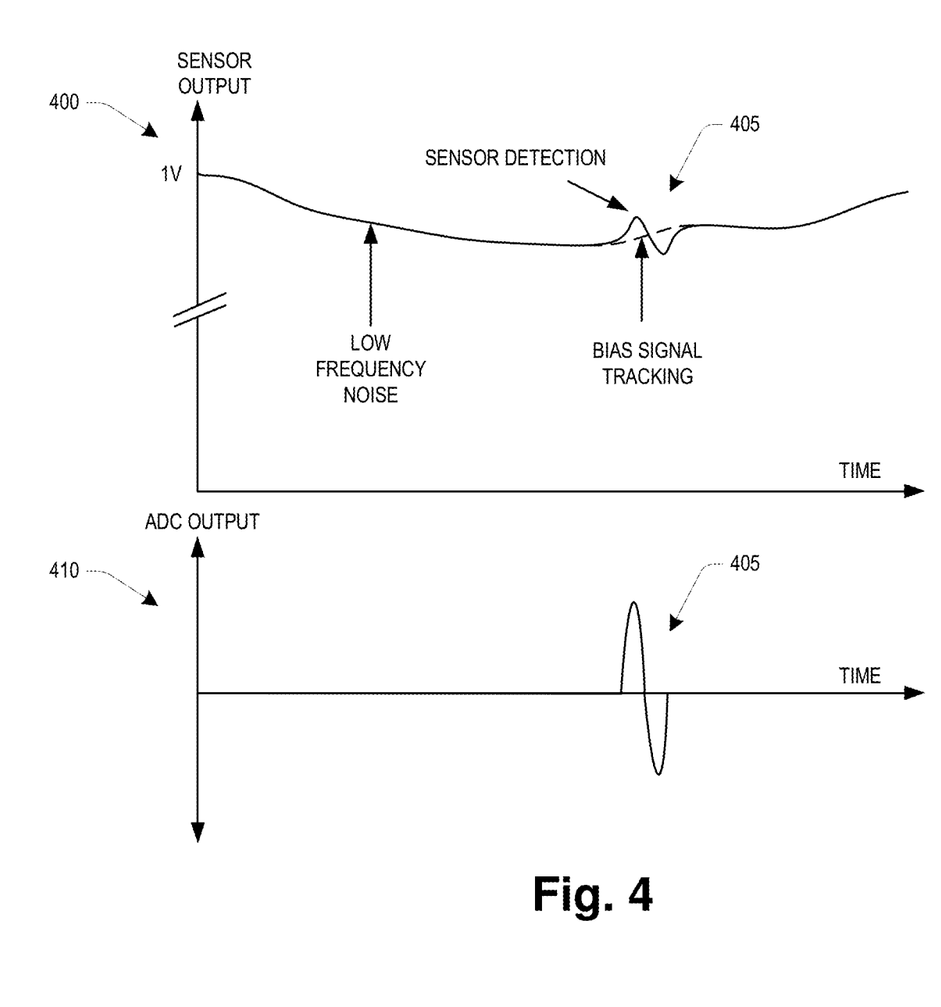
FIG. 4 is a diagram illustrating signal waveforms, in accordance with some embodiments.

FIG. 4 is a diagram illustrating signal waveforms, in accordance with some embodiments. The waveform 400 illustrates the output of the sensor 124 received at the PAB 106. The waveform 400 shows low-frequency noise onto which a sensor detection 405 is superimposed. In some embodiments, the low-frequency noise has an amplitude orders of magnitude greater than the sensor detection 405. For example, the low-frequency noise may have an average amplitude of about 1V, while the sensor detection 405 may exhibit peak-to-peak variation of only several mV. The low-frequency noise may mask the sensor detection making it difficult for the PASS 102 to detect the event registered by the sensor 124. The AOAC 108 generates the bias signal to track (i.e. dashed line), and thereby cancel the low-frequency noise. The waveform 410 illustrates the output signal from the ADC 112 that captures the sensor detection 405 without interference from the low-frequency noise.

Figure 5:
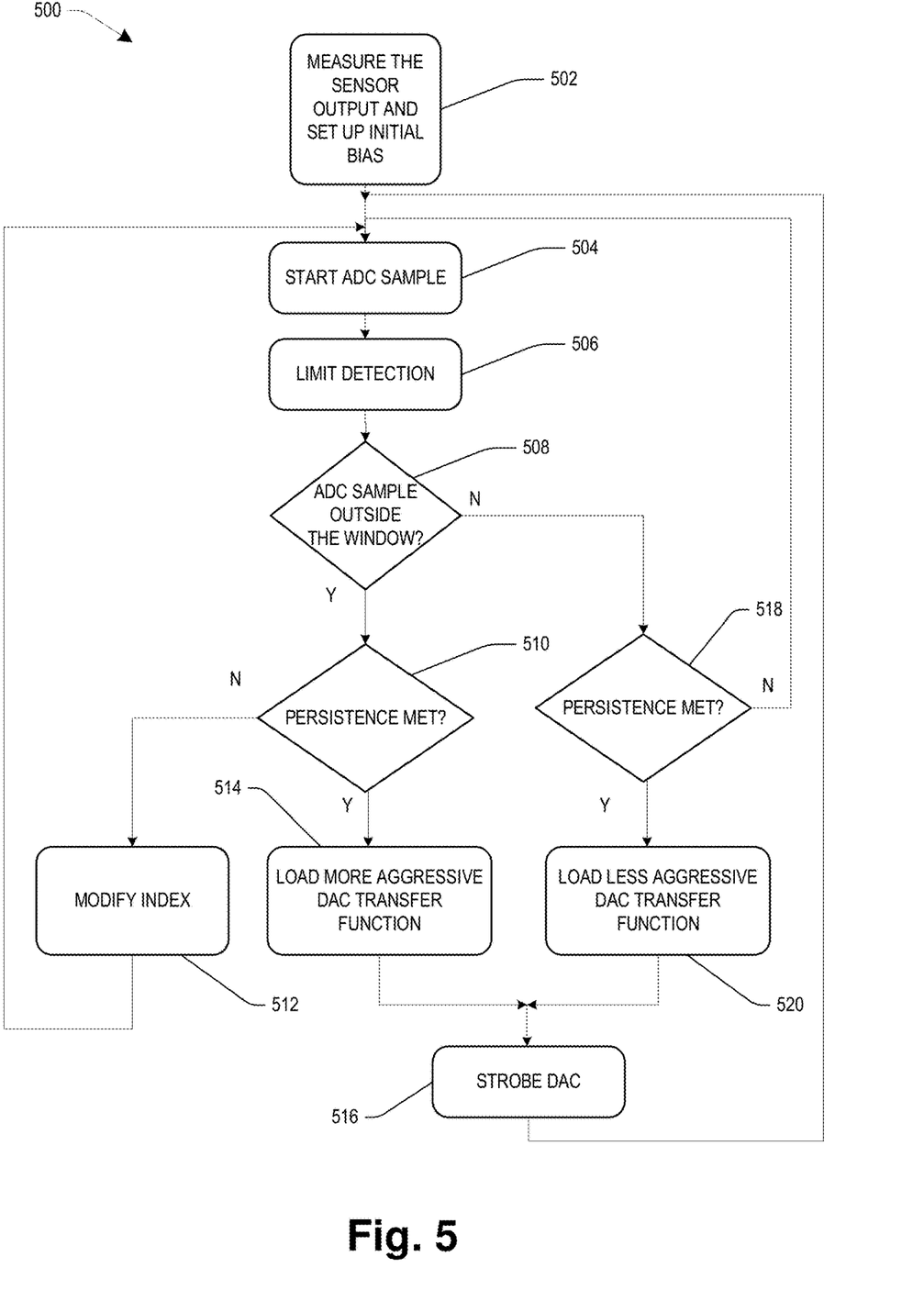
FIG. 5 is a flow diagram illustrating an example method for generating a bias signal for a sensing amplifier, in accordance with some embodiments.

FIG. 5 is a flow diagram illustrating an example method 500 for generating a bias signal for the sensing amplifier, in accordance with some embodiments. At 502, the AOAC 108 measures an initial value of the sensor output and sets up an initial bias index value. For example, based on the initial output sample from the ADC 112, the AOAC 108 will set the index to generate a bias that will result in the output of the amplifier in the PAB 106 to be in near the middle of its range. At 504, the AOAC 108 sends a sample command to the ADC 112. At 506, the AOAC 108 performs limit detection. In the illustrated example, the AOAC 108 performs limit detection based on a window associated with the operating range of the amplifier in the PAB 106. The window has an upper limit and a lower limit.

If the ADC sample is outside the window at 508, the AOAC 108 determines if the limit violation has persisted for a predetermined number of consecutive samples at 510 (e.g., two, three, or any number greater than two). For example, if the limit violation persists, the current transfer function for the DAC 104 may not be sufficiently aggressive to track the noise signal. Responsive to the persistence requirement not being met at 510, the AOAC 108 modifies the index provided to the DAC 104 by incrementing the index if the ADC sample was above the window or decrementing the index if the ADC sample was below the window at 512. The method 500 returns to 504 for the next sample. If the persistence requirement is met at 510, the AOAC 108 directs the DAC 104 at 514 to use a more aggressive transfer function having a greater slope than the previous transfer function, for example, by changing a pointer in the LUT 118 or by loading the selected transfer function into a specified memory region used by the DAC 104. The AOAC 108 strobes the DAC 104 at 516 to start using the new transfer function 118A, 118B, 118C, and the method 500 returns to 504. A strobe signal instructs the DAC 104 to output a new code. The AOAC 108 sends the strobe signal after loading or pointing to a new transfer function in the LUT 118 to cause the DAC 104 to output the first (or the default) code in the transfer function.

If the ADC sample is not outside the window at 508, the AOAC 108 determines a condition inside the window has persisted for a predetermined number of consecutive output samples at 518 (e.g., two, three, or any number greater than two). For example, if no limit violation persists for multiple samples, the noise may be relatively steady and a less aggressive transfer function may be sufficient to track the noise signal. If the persistence is not met at 518, the method 500 returns to 504. If the persistence is met at 518, the AOAC 108 directs the DAC 104 at 520 to use a less aggressive transfer function with a reduced slope, for example, by changing a pointer in the LUT 118 to a different transfer function start address or by loading the selected transfer function into a specified memory region used by the DAC 104 for storing the transfer function. In some embodiments, the AOAC 108 may also reduce the size of the window if the persistence is met at 518 to move the output of the amplifier in the PAB 106 closer to the midpoint of its operating range. The AOAC 108 strobes the DAC 104 at 516 to start using the new transfer function and the method 500 returns to 504.

Figure 6:
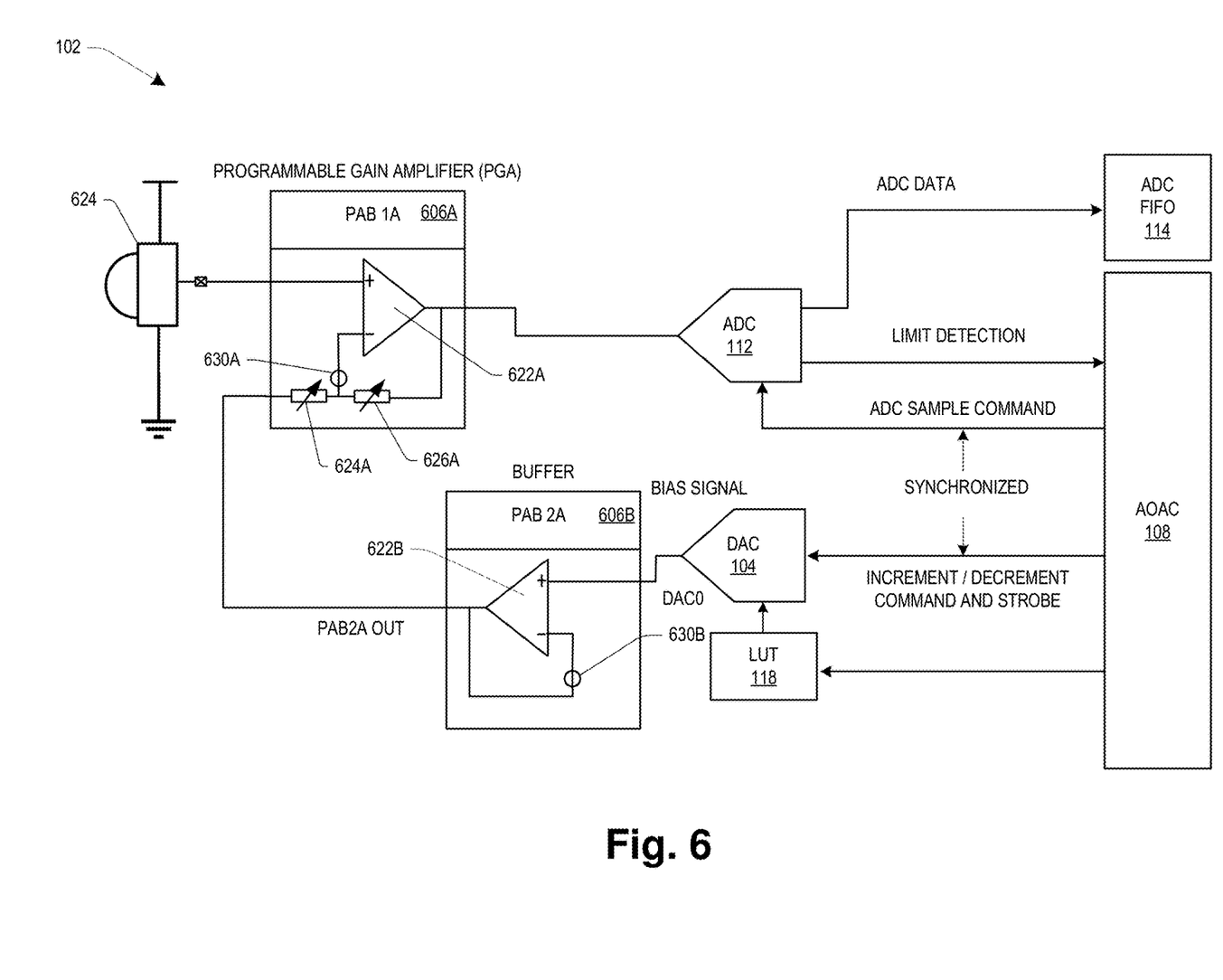
FIG. 6 is a diagram of the sensor system configured to cancel noise in a sensing application using a passive infrared sensor, in accordance with some embodiments.

FIG. 6 is a diagram of the PASS 102 configured to cancel noise in a sensing application using a passive infrared sensor 624, in accordance with some embodiments. Two PABs 606A and 606B are employed, designated as PAB 1A and PAB 2A. The PAB 606B is configured as a buffer, and the PAB 606A is configured as a programmable gain amplifier (PGA). The waveforms 400, 410 in FIG. 4 correspond to an embodiment where the sensor 124 (see FIG. 1) is the passive infrared sensor 624. The low-frequency noise source is ambient light.

With reference to FIG. 2, in a buffer topology for the PAB 606B, both the programmable input resistor 224 and the programmable feedback resistor 226 are shorted, and the switches 232 and 238 are open. The non-inverting input reference multiplexer 204 is configured to select the DAC0 reference signal, the non-inverting input terminal multiplexer 206 is disabled, the inverting input terminal multiplexer 208 is disabled, the resistor input terminal multiplexer 210 is disabled, and the resistor input reference multiplexer 212 is disabled. As shown in FIG. 6, the switch 630B is closed and the output of the operational amplifier 622B in the PAB 606B is the PAB2A OUT signal.

With reference to FIG. 2, in a PGA topology for the PAB 606A, the non-inverting input reference multiplexer 204 is disabled. The non-inverting input terminal multiplexer 206 is configured to select an external pin to which the passive infrared sensor 624 is connected. The inverting input terminal multiplexer 208 is disabled and the resistor input terminal multiplexer 210 is disabled. The resistor input reference multiplexer 212 is configured to select the PAB2 OUT signal (i.e., from the PAB 606B configured as a buffer). As shown in FIG. 6, the switch 630A is closed and the programmable input resistor 624A and the programmable feedback resistor 626A are configured to generate an amplifier gain (e.g., 1000-10000) for amplifying the difference between the sensor signal and the bias signal to generate an amplified sensor signal. The output of the operational amplifier 622A is routed to the ADC 112.

The bias signal output by the DAC 104 connects though the buffer PAB 6060B to the resistor input of the operational amplifier 622A in the PAB 606A to bias the reference input of the programmable gain amplifier PAB 606A to cancel the low-frequency noise in the form of ambient light.

Figure 7:
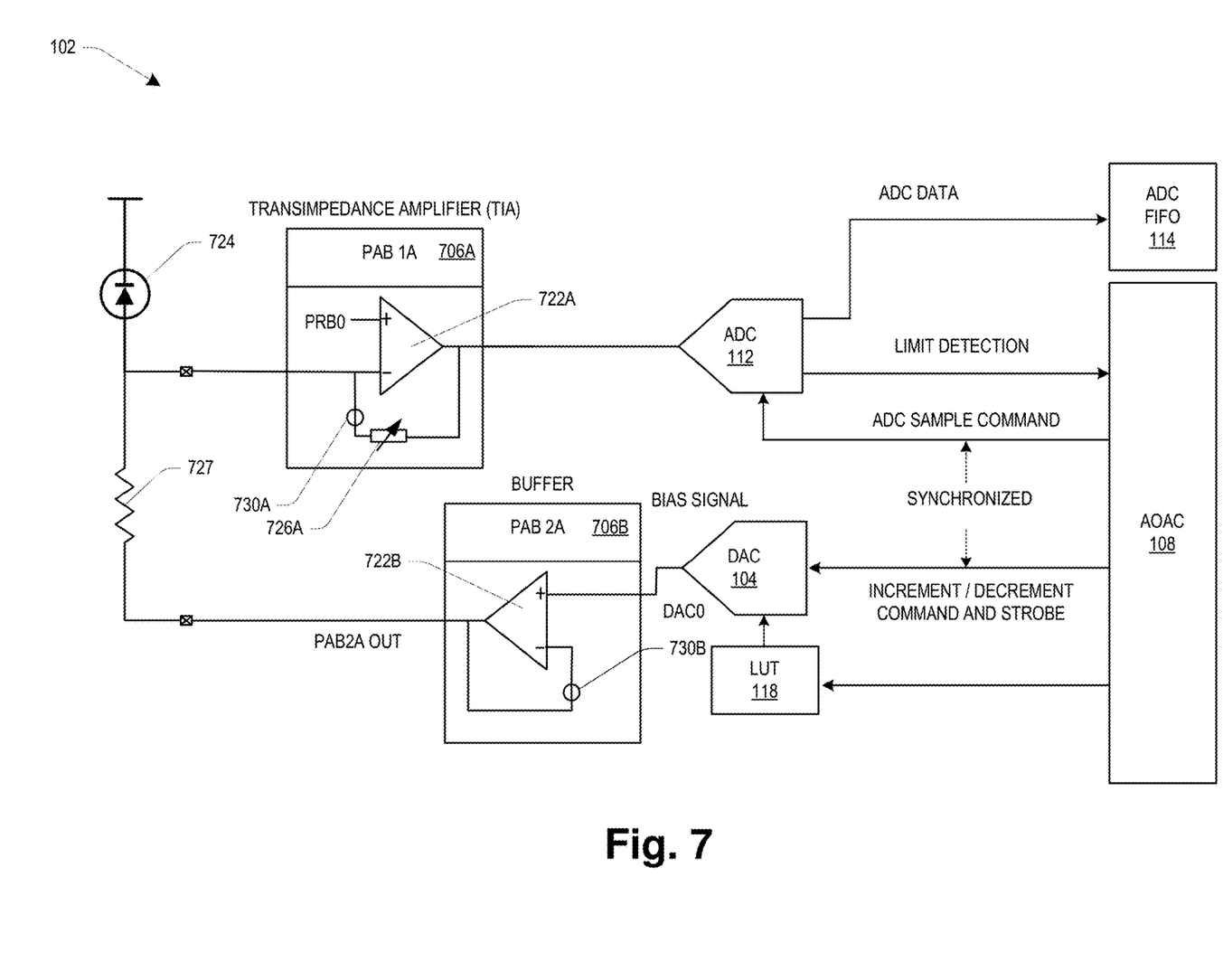
FIG. 7 is a diagram of the sensor system configured to cancel noise in a sensing application using a photodiode, in accordance with some embodiments.

FIG. 7 is a diagram of the PASS 102 configured to cancel noise in a sensing application using a photodiode 724, in accordance with some embodiments. The low-frequency noise source is ambient light. Two PABs 706A and 706B are employed, designated as PAB 1A and PAB 2A. The PAB 706B is configured as a buffer, and the PAB 706A is configured as a transimpedance amplifier (TIA) to perform a current-to-voltage conversion on the output of the photodiode 724.

With reference to FIG. 2, in a buffer topology for the PAB 706B, both the programmable input resistor 224 and the programmable feedback resistor 226 are shorted and the switches 232, 238 are open. The non-inverting input reference multiplexer 204 is configured to select the DAC0 reference signal, the non-inverting input terminal multiplexer 206 is disabled, the inverting input terminal multiplexer 208 is disabled, the resistor input terminal multiplexer 210 is disabled, and the resistor input reference multiplexer 212 is disabled. As shown in FIG. 7, the switch 730B is closed and the output of the operational amplifier 722B in the PAB 2A is the PAB2A OUT signal and is routed to a terminal P0:P7 of the PASS 102 by the switch 240 (see FIG. 2).

With reference to FIG. 2, in a TIA topology for the PAB 706A, the non-inverting input reference multiplexer 204 is configured to select a PRB0 reference voltage from the programmable reference unit 110. The non-inverting input terminal multiplexer 206 is disabled. The inverting input terminal multiplexer 208 is configured to select an external pin to which the photodiode 124PD is connected. The resistor input terminal multiplexer 210 is disabled. The resistor input reference multiplexer 212 is disabled. An external circuit 727 (e.g., a resistor) is connected between the external pin to which the PAB2A OUT signal was routed and the external pin to which the photodiode 724 is connected. The programmable input resistor 224 is configured as an open circuit. As shown in FIG. 7, the switch 730A is closed and the programmable feedback resistor 726A is configured to generate a feedback gain for the TIA. The operational amplifier 722A amplifies the difference between the reference voltage and the sensor signal to generate an amplified sensor signal, where the input current to the operational amplifier 722A is converted to an output voltage in the amplified sensor signal. The output of the operational amplifier 722A is routed to the ADC 112. In some embodiments, a similar configuration may be provided by configuring the multiplexer 208 to send the photodiode signal to the inverting terminal of the operational amplifier 722B and configuring the multiplexer 212 to send the DAC signal to the resistor 224 (see FIG. 2) and use the resistor 224 in place of the external resistor 727.

The bias signal output by the DAC 104 connects though the buffer PAB 706B and through the external circuit 727 to the inverting input of the operational amplifier 222A in the PAB 706A. The output of the photodiode 724 is also connected to the inverting input of the operational amplifier 222A. The bias signal thus biases the output signal to cancel the low-frequency noise in the form of ambient light.

Figure 8:
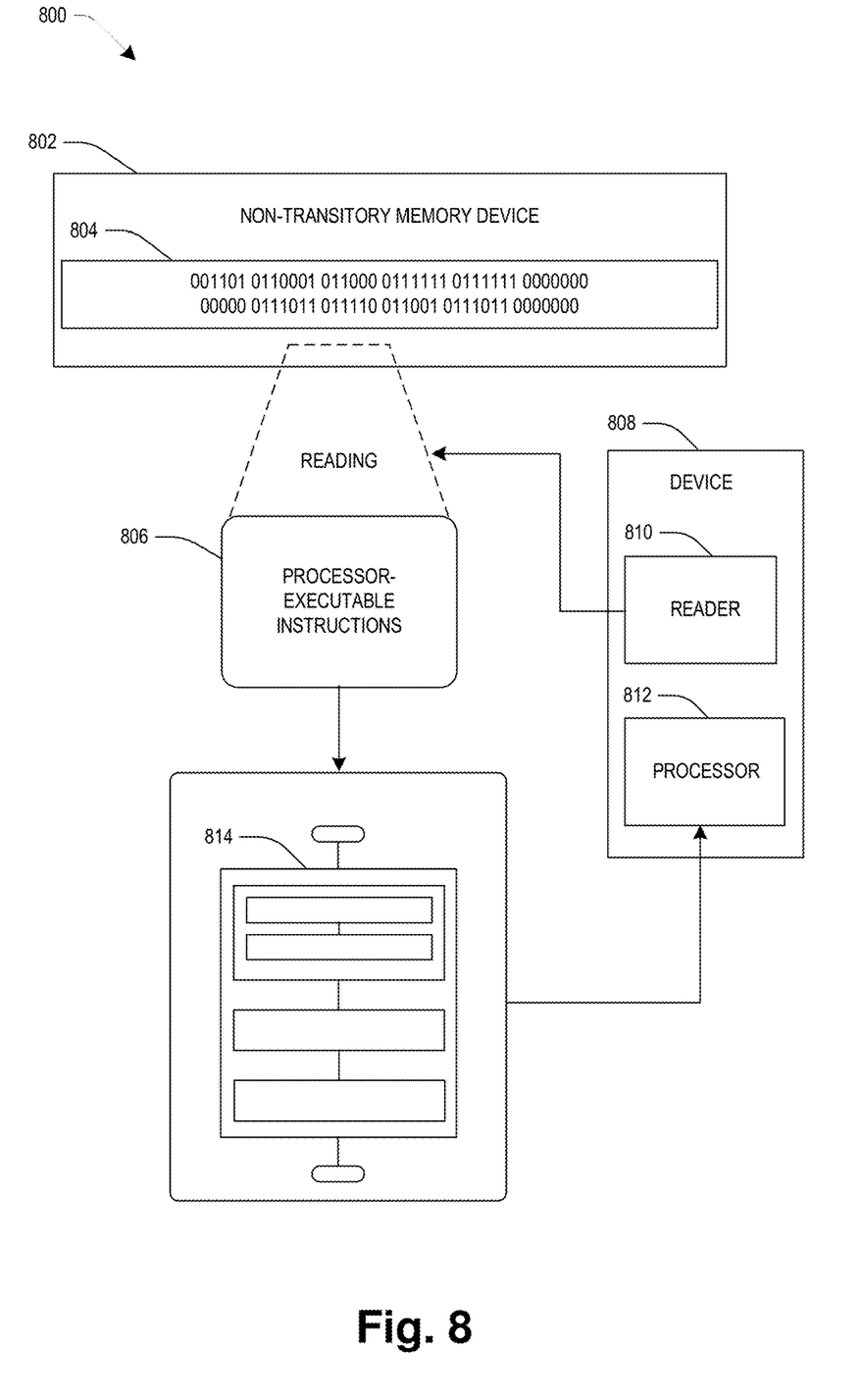
FIG. 8 illustrates an exemplary embodiment of a computer-readable medium, in accordance with some embodiments.

FIG. 8 illustrates an exemplary embodiment 800 of a computer-readable medium 802, in accordance with some embodiments. One or more embodiments involve a computer-readable medium comprising processor-executable instructions configured to implement one or more of the techniques presented herein. The embodiment 800 comprises a non-transitory computer-readable medium 802 (e.g., a CD-R, DVD-R, flash drive, a platter of a hard disk drive, etc.), on which is encoded computer-readable data 804. This computer-readable data 804 in turn comprises a set of processor-executable computer instructions 806 that, when executed by a computing device 808 including a reader 810 for reading the processor-executable computer instructions 806 and a processor 812 for executing the processor-executable computer instructions 806, are configured to facilitate operations according to one or more of the principles set forth herein. In some embodiments, the processor-executable computer instructions 806, when executed, are configured to facilitate performance of a method 814, such as at least some of the aforementioned method(s). In some embodiments, the processor-executable computer instructions 806, when executed, are configured to facilitate implementation of a system, such as at least some of the one or more aforementioned system(s). Many such computer-readable media may be devised by those of ordinary skill in the art that are configured to operate in accordance with the techniques presented herein.

The term "computer readable media" and/or the like may include communication media. Communication media typically embodies computer readable instructions or other data in a "modulated data signal" such as a carrier wafer or other transport mechanism and includes any information delivery media. The term "modulated data signal" may include a signal that has one or more of its characteristics set or changed in such a manner as to encode information in the signal. The term "computer readable media" may include communication media. Communication media typically embodies computer readable instructions or other data in a "modulated data signal" such as a carrier wafer or other transport mechanism and includes any information delivery media. The term "modulated data signal" may include a signal that has one or more of its characteristics set or changed in such a manner as to encode information in the signal.

According to some embodiments, a sensing system comprises a sensor terminal, a digital-to-analog converter (DAC) configured to generate a bias signal based on an index, a first programmable analog block having a first amplifier connected to the sensor terminal and configured to amplify a sensor signal received at the sensor terminal based on the bias signal to generate an amplified sensor signal, an analog-to-digital converter (ADC) configured to sample the amplified sensor signal to generate an output sample, and a controller configured to detect a limit violation associated with the output sample and modify the index to generate a modified index responsive to the limit violation, wherein the DAC is configured to adjust the bias signal based on the modified index.

According to some embodiments, the DAC is connected to a first input terminal of the first amplifier, the sensor terminal is connected to a second input terminal of the first amplifier, and the first amplifier amplifies the sensor signal based on a difference between the sensor signal at the second input terminal and the bias signal at the first input terminal to generate the amplified sensor signal.

According to some embodiments, a reference voltage is connected to a first input terminal of the first amplifier, a second input terminal of the first amplifier is connected to the sensor terminal, the DAC is connected to the sensor terminal, and the first amplifier amplifies the sensor signal based on a difference between the reference voltage at the first input terminal and a voltage at the second input terminal.

According to some embodiments, the DAC is configured to generate the bias signal using a first transfer function that defines the bias signal as a function of the index.

According to some embodiments, the controller is configured to configure the DAC with a second transfer function that defines the bias signal as a function of the index responsive to identifying two or more limit violations, and the second transfer function has a slope greater than a slope of the first transfer function.

According to some embodiments, the controller is configured to configure the DAC with a second transfer function responsive to not detecting the limit violation associated with the output sample, and the second transfer function has a slope greater than a slope of the first transfer function.

According to some embodiments, the sensing system comprises a second programmable analog block having a second amplifier configured as a buffer, wherein the second amplifier is connected between the DAC and the first amplifier.

According to some embodiments, the first amplifier is configured as a programmable gain amplifier, and the sensor signal comprises an infrared sensor signal.

According to some embodiments, the first amplifier is configured as a transimpedance amplifier, and the sensor signal comprises a photodiode sensor signal.

According to some embodiments, a sensing system comprises a first sensor terminal, a second sensor terminal, a digital-to-analog converter (DAC) configured to generate a bias signal based on an index, a multiplexer connected to the first sensor terminal or the second sensor terminal and configured to generate a sensor output, a first programmable analog block having a first amplifier connected to the sensor output and configured to amplify a sensor signal received at the sensor output based on the bias signal to generate an amplified sensor signal, an analog-to-digital converter (ADC) configured to sample the amplified sensor signal to generate an output sample, and a controller configured to configure the multiplexer to select one of the first sensor terminal or the second sensor terminal, configure the first amplifier based on the configuration of the multiplexer, and responsive to detecting a limit violation associated with the output sample, modifying the index to generate a modified index, wherein the DAC is configured to adjust the bias signal based on the modified index.

According to some embodiments, the DAC is connected to a first input terminal of the first amplifier, the sensor output is connected to a second input terminal of the first amplifier, the first amplifier is configured as a programmable gain amplifier, and the first amplifier amplifies the sensor signal based on a difference between the sensor signal at the second input terminal and the bias signal at the first input terminal to generate the amplified sensor signal.

According to some embodiments, the sensing system comprises an external terminal, and an external circuit connecting the first sensor terminal to the external terminal, wherein a reference voltage is connected to a first input terminal of the first amplifier, a second input terminal of the first amplifier is connected to the sensor output, the DAC is connected to the external terminal, the first amplifier is configured as a transimpedance amplifier, and the first amplifier amplifies the sensor signal based on a difference between the reference voltage at the first input terminal and a voltage at the second input terminal.

According to some embodiments, the DAC is configured to generate the bias signal using a first transfer function that defines the bias signal as a function of the index, the controller is configured to configure the DAC with a second transfer function that defines the bias signal as a function of the index responsive to identifying two or more limit violations, and the second transfer function has a slope greater than a slope of the first transfer function.

According to some embodiments, the DAC is configured to generate the bias signal using a first transfer function that defines the bias signal as a function of the index, the controller is configured to configure the DAC with a second transfer function responsive to not detecting the limit violation associated with the output sample, and the second transfer function has a slope less than a slope of the first transfer function.

According to some embodiments, the sensing system comprises a second programmable analog block having a second amplifier configured as a buffer, wherein the second amplifier is connected between the DAC and the first amplifier.

According to some embodiments, a method comprises generating a bias signal based on an index, connecting a first amplifier of a first programmable analog block to a sensor terminal, amplifying a sensor signal received at the sensor terminal in the first amplifier based on the bias signal to generate an amplified sensor signal, sampling the amplified sensor signal to generate an output sample, responsive to detecting a limit violation associated with the output sample, modifying the index to generate a modified index, and adjusting the bias signal based on the modified index.

According to some embodiments, the method comprises connecting the bias signal to a first input terminal of the first amplifier, and connecting the sensor terminal to a second input terminal of the first amplifier, wherein amplifying the sensor signal comprises amplifying the sensor signal based on a difference between the sensor signal and the bias signal to generate the amplified sensor signal.

According to some embodiments, the method comprises connecting a reference voltage to a first input terminal of the first amplifier, connecting a second input terminal of the first amplifier to the sensor terminal, and connecting the bias signal to the sensor terminal, wherein amplifying the sensor signal comprises amplifying the sensor signal based on a difference between the reference voltage at the first input terminal and a voltage at the second input terminal.

According to some embodiments, generating the bias signal comprises generating the bias signal using a first transfer function that defines the bias signal as a function of the index, and the method comprises responsive to identifying two or more limit violations, generating the bias signal using a second transfer function that defines the bias signal as a function of the index responsive using a slope greater than a slope of the first transfer function.

According to some embodiments, generating the bias signal comprises generating the bias signal using a first transfer function that defines the bias signal as a function of the index, and the method comprises responsive to not detecting the limit violation, generating the bias signal using a second transfer function that defines the bias signal as a function of the index responsive using a slope less than a slope of the first transfer function.

Various operations of embodiments are provided herein. In one embodiment, one or more of the operations described may constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. Also, it will be understood that not all operations are necessary in some embodiments.

Any aspect or design described herein as an "example" is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A sensing system, comprising:
   a sensor terminal;
   a digital-to-analog converter (DAC) configured to generate an analog bias signal based on an index;
   a first programmable analog block having a first amplifier connected to the sensor terminal and configured to amplify a sensor signal received at the sensor terminal based on the analog bias signal to generate an amplified sensor signal;
   an analog-to-digital converter (ADC) configured to sample the amplified sensor signal to generate an output sample; and
   a controller configured to detect a limit violation associated with the output sample and an operating range of the ADC and modify the index to generate a modified index responsive to the limit violation, wherein:
   the DAC is configured to adjust the analog bias signal based on the modified index.

2. The sensing system of claim 1, wherein:
   the DAC is connected to a first input terminal of the first amplifier;
   the sensor terminal is connected to a second input terminal of the first amplifier; and
   the first amplifier amplifies the sensor signal based on a difference between the sensor signal at the second input terminal and the analog bias signal at the first input terminal to generate the amplified sensor signal.

3. The sensing system of claim 1, wherein:
   a reference voltage is connected to a first input terminal of the first amplifier;
   a second input terminal of the first amplifier is connected to the sensor terminal;
   the DAC is connected to the sensor terminal; and
   the first amplifier amplifies the sensor signal based on a difference between the reference voltage at the first input terminal and a voltage at the second input terminal.

4. The sensing system of claim 1, wherein:
   the DAC is configured to generate the analog bias signal using a first transfer function that defines the analog bias signal as a function of the index.

5. The sensing system of claim 4, wherein:
   the controller is configured to configure the DAC with a second transfer function that defines the analog bias signal as a function of the index responsive to identifying two or more limit violations; and
   the second transfer function has a slope greater than a slope of the first transfer function.

6. The sensing system of claim 4, wherein:
   the controller is configured to configure the DAC with a second transfer function responsive to not detecting the limit violation associated with the output sample; and
   the second transfer function has a slope less greater than a slope of the first transfer function.

7. The sensing system of claim 1, comprising:
a second programmable analog block having a second amplifier configured as a buffer, wherein:
the second amplifier is connected between the DAC and the first amplifier.

8. The sensing system of claim 1, wherein:
the first amplifier is configured as a programmable gain amplifier; and
the sensor signal comprises an infrared sensor signal.

9. The sensing system of claim 8, wherein:
the first amplifier is configured as a transimpedance amplifier; and
the sensor signal comprises a photodiode sensor signal.

10. A sensing system, comprising:
a first sensor terminal;
a second sensor terminal;
a digital-to-analog converter (DAC) configured to generate a bias signal based on an index;
a multiplexer connected to the first sensor terminal or the second sensor terminal and configured to generate a sensor output;
a first programmable analog block having a first amplifier connected to the sensor output and configured to amplify a sensor signal received at the sensor output based on the bias signal to generate an amplified sensor signal;
an analog-to-digital converter (ADC) configured to sample the amplified sensor signal to generate an output sample; and
a controller configured to:
configure the multiplexer to select one of the first sensor terminal or the second sensor terminal;
configure the first amplifier based on the configuration of the multiplexer; and
responsive to detecting a limit violation associated with the output sample, modify the index to generate a modified index, wherein:
the DAC is configured to adjust the bias signal based on the modified index.

11. The sensing system of claim 10, wherein:
the DAC is connected to a first input terminal of the first amplifier;
the sensor output is connected to a second input terminal of the first amplifier;
the first amplifier is configured as a programmable gain amplifier; and
the first amplifier amplifies the sensor signal based on a difference between the sensor signal at the second input terminal and the bias signal at the first input terminal to generate the amplified sensor signal.

12. The sensing system of claim 10, comprising:
an external terminal; and
an external circuit connecting the first sensor terminal to the external terminal, wherein
a reference voltage is connected to a first input terminal of the first amplifier;
a second input terminal of the first amplifier is connected to the sensor output;
the DAC is connected to the external terminal;
the first amplifier is configured as a transimpedance amplifier; and
the first amplifier amplifies the sensor signal based on a difference between the reference voltage at the first input terminal and a voltage at the second input terminal.

13. The sensing system of claim 10, wherein:
the DAC is configured to generate the bias signal using a first transfer function that defines the bias signal as a function of the index;
the controller is configured to configure the DAC with a second transfer function that defines the bias signal as a function of the index responsive to identifying two or more limit violations; and
the second transfer function has a slope greater than a slope of the first transfer function.

14. The sensing system of claim 10, wherein:
the DAC is configured to generate the bias signal using a first transfer function that defines the bias signal as a function of the index;
the controller is configured to configure the DAC with a second transfer function responsive to not detecting the limit violation associated with the output sample; and
the second transfer function has a slope less than a slope of the first transfer function.

15. The sensing system of claim 10, comprising:
a second programmable analog block having a second amplifier configured as a buffer, wherein:
the second amplifier is connected between the DAC and the first amplifier.

16. A method, comprising:
generating an analog bias signal based on an index;
connecting a first amplifier of a first programmable analog block to a sensor terminal;
amplifying a sensor signal received at the sensor terminal in the first amplifier based on the analog bias signal to generate an amplified sensor signal;
sampling the amplified sensor signal in an analog-to-digital converter (ADC) to generate an output sample;
responsive to detecting a limit violation associated with the output sample and an operating range of the ADC, modifying the index to generate a modified index; and
adjusting the analog bias signal based on the modified index.

17. The method of claim 16, comprising:
connecting the analog bias signal to a first input terminal of the first amplifier; and
connecting the sensor terminal to a second input terminal of the first amplifier, wherein:
amplifying the sensor signal comprises amplifying the sensor signal based on a difference between the sensor signal and the analog bias signal to generate the amplified sensor signal.

18. The method of claim 16, comprising:
connecting a reference voltage to a first input terminal of the first amplifier; connecting a second input terminal of the first amplifier to the sensor terminal; and
connecting the analog bias signal to the sensor terminal, wherein:
amplifying the sensor signal comprises amplifying the sensor signal based on a difference between the reference voltage at the first input terminal and a voltage at the second input terminal.

19. The method of claim 16, wherein:
generating the analog bias signal comprises generating the analog bias signal using a first transfer function that defines the analog bias signal as a function of the index; and
the method comprises:
responsive to identifying two or more limit violations, generating the analog bias signal using a second transfer function that defines the bias signal as a function of the index responsive using a slope greater than a slope of the first transfer function.

20. The method of claim 16, wherein:

generating the analog bias signal comprises generating the analog bias signal using a first transfer function that defines the analog bias signal as a function of the index; and the method comprises:

responsive to not detecting the limit violation, generating the analog bias signal using a second transfer function that defines the bias signal as a function of the index responsive using a slope less than a slope of the first transfer function.

* * * * *